US007656330B2

(12) United States Patent
O'Dowd et al.

(10) Patent No.: US 7,656,330 B2
(45) Date of Patent: Feb. 2, 2010

(54) AUTOMATIC RANGE SHIFT SYSTEM AND METHOD FOR AN ANALOG TO DIGITAL CONVERTER

(75) Inventors: John O'Dowd, Crecora (IE); Kevin Jennings, Barna (IE); Tadhg Creedon, Furbo (IE)

(73) Assignee: Analog Devices, Inc., Norwood, MA (US)

( * ) Notice: Subject to any disclaimer, the term of this patent is extended or adjusted under 35 U.S.C. 154(b) by 57 days.

(21) Appl. No.: 12/154,330

(22) Filed: May 22, 2008

(65) Prior Publication Data
US 2008/0291067 A1 Nov. 27, 2008

Related U.S. Application Data

(60) Provisional application No. 60/931,447, filed on May 23, 2007.

(51) Int. Cl.
*H03M 3/00* (2006.01)
(52) U.S. Cl. ........................................ 341/143; 341/155
(58) Field of Classification Search ................ 341/143, 341/155, 156, 120, 118, 172
See application file for complete search history.

(56) References Cited

U.S. PATENT DOCUMENTS 4,903,023 A 2/1990 Evans et al.
6,032,109 A 2/2000 Ritmiller, III
6,603,416 B2 8/2003 Masenas et al.
7,265,694 B2 * 9/2007 Guidry ....................... 341/120

OTHER PUBLICATIONS

Analog Devices, Inc., Bridge Transducer ADC, AD7730/AD7730L, 1998, pp. 1-52.
Wolfson Microelectronics Ltd., WM8141 PGA and Offset DAC Calibration Procedure, WAN_0101, 2001, Application Note, Apr. 2001, Rev 1-2.
Silicon Laboratories, C8051F35x Delta-Sigma ADC User's Guide, AN 217, Rev. 02. Feb. 2005, pp. 1-18.
Texas Instruments ADC Offset in MSC12xx Devices, Application Report SBAA097B-Jul. 2003-Revised May 2004, pp. 1-20.

* cited by examiner

*Primary Examiner*—Rexford N Barnie
*Assistant Examiner*—Joseph Lauture
(74) *Attorney, Agent, or Firm*—Kenyon & Kenyon LLP

(57) ABSTRACT

Automatic range shifting for an analog to digital converter (ADC) includes combining an external analog input and a DAC output to provide an input to the ADC, detecting whether the range of the output of the ADC is above a predetermined upper range limit or below a predetermined lower range limit, and generating an adjustment code to increase the DAC output if the ADC output is above the upper range limit and to decrease the DAC output if the ADC output is below the lower range limit for decreasing the ADC input when the ADC output is above the upper limit and to increase the ADC input when the ADC output is below the lower limit to keep the ADC input within the ADC range.

22 Claims, 7 Drawing Sheets

These blocks get executed only after DAC has been automatically updated.

LINEAR INTERPOLATION

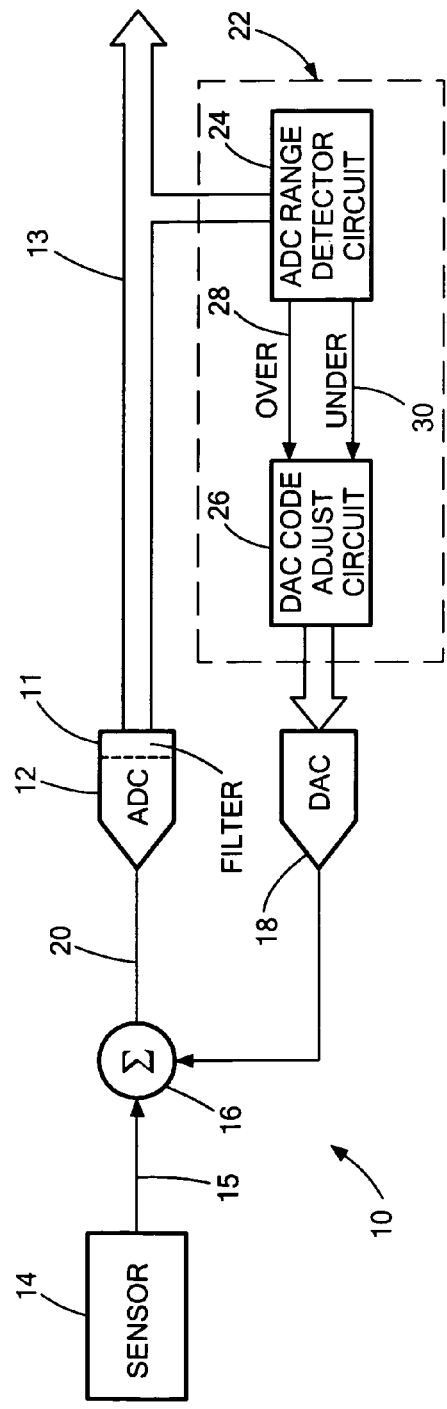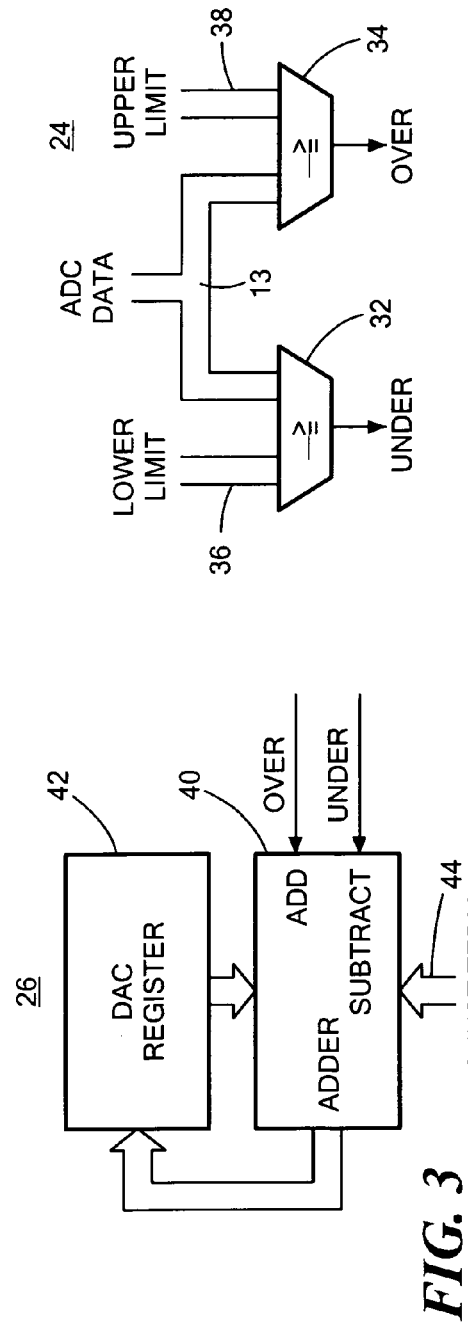

US 7,656,330 B2

AUTOMATIC RANGE SHIFT SYSTEM AND METHOD FOR AN ANALOG TO DIGITAL CONVERTER

RELATED APPLICATIONS

This application claims benefit of and priority to U.S. Provisional Application Ser. No. 60/931,447 filed May 23, 2007 incorporated herein by this reference.

FIELD OF THE INVENTION

This invention relates to an automatic range shift system and method for an analog to digital converter.

BACKGROUND OF THE INVENTION

The complexity, size, and typically the power of an analog-to-digital converter increases with the resolution of conversion result required. Typically the minimum and maximum input signals are mapped onto the span of the converter. However, in many applications the input signal may have a short-term variation which covers a subset of the converter span. The resolution required is calculated over the full span, but if you focus on the sub-span a much lower resolution is adequate. Another way of looking at the problem is that a large portion of the span is unused for most of the time. The result is that for most of the time the converter used has excess resolution, with a more complex and costly circuit.

One solution is to use a converter with a lower span, with sufficient resolution and span to cover the short-term signal variations. Typically the output of an offsetting DAC is subtracted from the input signal to the ADC, so as to remove any large offsets and keep the signal within the reduced span. Such approaches use a DAC to subtract an offset from the input signal for the ADC. However, they do not automatically update the DAC in response to the ADC signal going outside range. Instead, they are simply set to a fixed offset by a host micro, typically after a calibration cycle or offset nulling procedure. They do not adaptively set the DAC to keep the ADC input within range, nor do they teach this approach. Therefore they do not teach any methods of automatic correction of the ADC output codes to take the DAC change into account.

It is common practice to process the output signal from sensors, an analog signal, using microprocessors or similar digital signal processing devices. The analog signal is translated into the digital domain by an analog-to-digital converter (ADC). An ADC is what is termed a mixed-signal device in that it contains both analog and digital circuitry. The ADC converts the analog signal into a digital word of a given number of bits, N. The ADC will have $2^N$ steps. The span of the ADC is the difference between the minimum and maximum voltages that can be applied to the input, i.e. the voltages that give an ADC output of the smallest and largest digital word for number of bits N. Taking the example that, N is 16, so the smallest digital word is 0000h (0 decimal) and the largest is FFFFh (65535 decimal), corresponding to input voltages of 0V and 4V, respectively, then the step size of the ADC, its resolution, is given as the span divided by the number of digital steps, i.e. (SPAN/$2^N$). In this example the resolution is 61 uV. This means that the ADC can only measure steps of more than 61 uV; an input change of smaller than this amount might not result in a change of the digital output word.

The design of an ADC typically becomes exponentially more difficult as the number of bits N increases. The analog circuitry in the ADC becomes larger, more complex and requires more power. By comparison, the digital circuitry will become larger but marginally more difficult; extra digital processing is relatively easily added. In many cases the signal being digitized is slowly varying, and this slow variation is being measured. For example assume the signal being measured has a range from 0v to 4v, but might have a much lower variation for successive measurement points. If we assume that the maximum variation for successive measurements is known to be no more than say 0.1v, then at any given time most of the full converter span is not being used. If we reduce the span from 4V to 0.25V we can achieve the 61 uV ADC step size with an ADC with a 12-bit digital output word (N=12), and not require the 16-bit design. Per the earlier comments, the design of a 12-bit ADC is significantly easier, smaller, and lower power than a 16-bit ADC, all other parameters being equal. The required ADC step size could be obtained with a 12-bit ADC working on a 0.25V sub-span of the full 0 to 4V range. However, it is necessary to be able to adjust the location of the 0.25V sub-span across the full range; a fixed sub-span of 0 to 0.25V will not meet the objective. A commonly used approach is to use a DAC to subtract a voltage from the input signal. There are several examples of ADC systems with this architecture. In all such cases the DAC is typically set once when configuring and/or calibrating the system, and is not normally changed by the converter itself. The DAC setting is typically written to the part by a microprocessor. The DAC is not set in a stand-alone fashion, a host controller is required.

BRIEF SUMMARY OF THE INVENTION

It is therefore an object of this invention to provide an improved automatic range shift system and method for an analog to digital converter (ADC).

It is a further object of this invention to provide such an improved automatic range shift system and method which allows for higher resolution from coarser ADCs by shifting the ADC input signal to stay within the more limited range of a coarser ADC.

It is a further object of this invention to provide such an improved automatic range shift system and method which continuously shifts to keep a varying input signal within the reduced range of the ADC.

It is a further object of this invention to provide such an improved automatic range shift system and method which achieves higher resolution using smaller, lower power ADCs.

It is a further object of this invention to provide such an improved automatic range shift system and method which avoids the use of ADCs with excess resolution and more complex costly circuitry.

It is a further object of this invention to provide such an improved automatic range shift system and method which allows the DAC step to be calculated within the accuracy of the ADC.

It is a further object of this invention to provide such an improved automatic range shift system and method which allows larger input signal variations to be measured in addition to smaller short-term variations without introducing errors due to inaccuracies in the offsetting DAC.

The invention results from the realization that an improved automatic range shift system and method for an ADC which allows higher resolution with coarser ADCs can be achieved by shifting the ADC input to keep it within the more limited ADC range by combining an external analog input and the DAC output to provide an input to the ADC; detecting whether the range of the output of the ADC is above a predetermined upper range limit or below a predetermined lower range limit and generating an adjustment code to increase the DAC output if the ADC output is above the upper range limit and to decrease the DAC output if the ADC output is below the lower range limit, for decreasing the ADC input when the ADC output is above the upper limit and to increase the ADC input when the ADC output is below the lower limit, to keep the ADC input within the ADC range.

The subject invention, however, in other embodiments, need not achieve all these objectives and the claims hereof should not be limited to structures or methods capable of achieving these objectives.

This invention features an automatic range shift system for an analog to digital converter (ADC) including a digital to analog converter (DAC), a first summing circuit for combining an external analog input and the DAC output to provide an input to the ADC and a control circuit for detecting whether the range of the output of an ADC is above a predetermined upper range limit or below a predetermined lower range limit and generating an adjustment code to increase the DAC output if the ADC output is above the upper range limit and to decrease the DAC output if the ADC output is below the lower range limit, for decreasing the ADC input when the ADC output is above the upper limit and to increase the ADC input when the ADC output is below the lower limit to keep the ADC input within the ADC range.

In a preferred embodiment the control circuit may include a range detector for detecting whether the output of an ADC is above a predetermined upper or below a predetermined lower range limit and a DAC code adjust circuit responsive to the range detector for generating an adjustment code to increase the DAC output if the ADC output is above the upper range limit and to decrease the DAC output if the ADC output is below the lower range limit to decrease the ADC input when the ADC output is above the upper limit and to increase the ADC input when the ADC output is below the lower limit to keep the ADC input within the ADC range. There may be a filter associated with the ADC for filtering its output before delivery to the DAC control circuit. The range detectors may include a comparator circuit. The comparator circuit may include a lower comparator to compare the ADC output with the lower limit and an upper comparator to compare the ADC output with the upper limit. The DAC code adjust circuit may include a register for storing the present DAC code and an adder for adding or subtracting an adjust term in response to the ADC output being above the upper limit or the ADC output being below the lower limit. There may be a correction circuit having a storage device for storing a sample history of the ADC output, a predictor circuit responsive to the DAC adjustment for generating a correction term and a second summing circuit for combining the correction term with the ADC output to correct for the DAC adjustment to the ADC. The second summing circuit may add the correction term to the ADC output when the ADC output is above the upper limit and may subtract it from the ADC output when the ADC output is below the lower limit. There may be an averaging circuit responsive to the ADC output to provide an average ADC output. There may be a correction circuit having a storage device for storing a sample history of the ADC output, a predictor circuit responsive to the DAC adjustment for generating a correction term and a third summing circuit for combining the correction term with the average ADC output to correct for the DAC adjustment to the ADC. The third summing circuit may subtract the converter term from the average ADC output when the ADC output is above the upper limit and add it to the average ADC output when the ADC output is below the lower limit. There may be a threshold circuit responsive to the averaging circuit for defining an average threshold and a comparator responsive to the threshold circuit and the ADC output for indicating when the ADC output has moved beyond the threshold relative to the average ADC output.

The invention also features a automatic range shifting method for an analog to digital converter (ADC) including combining an external analog input and a DAC output to provide an input to the ADC, detecting whether the range of the output of an ADC is above a predetermined upper range limit or below a predetermined lower range limit and generating an adjustment code to increase the DAC output if the ADC output is above the upper range limit and to decrease the DAC output if the ADC output is below the lower range limit, for decreasing the ADC input when the ADC output is above the upper limit and to increase the ADC input when the ADC output is below the lower limit to keep the ADC input within the ADC range.

In a preferred embodiment the ADC output may be compared with the lower limit and with the upper limit. Generating an adjustment code may include storing the present DAC code and adding or subtracting an adjust term in response to the ADC output being above the upper limit or the ADC output being below the lower limit. The output of the ADC may be filtered before being used to generate an adjustment code for the DAC. The automatic range shifting method may further include storing a sample history of the ADC output and generating a correction term and for combining the correction term with the ADC output to correct for the DAC adjustment to the ADC. The correction term may be added to the ADC output when the ADC output is above the upper limit and subtracted from the ADC output when the ADC output is below the lower limit. The automatic range shifting method may further include averaging the ADC output to provide an average ADC output. The automatic range shifting method may further include storing a sample history of the ADC output generating a correction term and combining the correction term with the average ADC output to correct for the DAC adjustment to the ADC. The automatic range shifting method may further include subtracting the converter term from the average ADC output when the ADC output is above the upper limit and adding it to the average ADC output when the ADC output is below the lower limit. The automatic range shifting method may further include defining an average threshold indicating when the ADC output has moved beyond the threshold relative to the average ADC output.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIG. 1 is a schematic block diagram of an automatic range shift system according to this invention;

FIG. 2 is a more detailed schematic diagram of the ADC range detector circuit of FIG. 1;

FIG. 3 is a more detailed schematic diagram of the DAC code adjust circuit of FIG. 1;

DETAILED DESCRIPTION OF THE INVENTION

Figure 4:
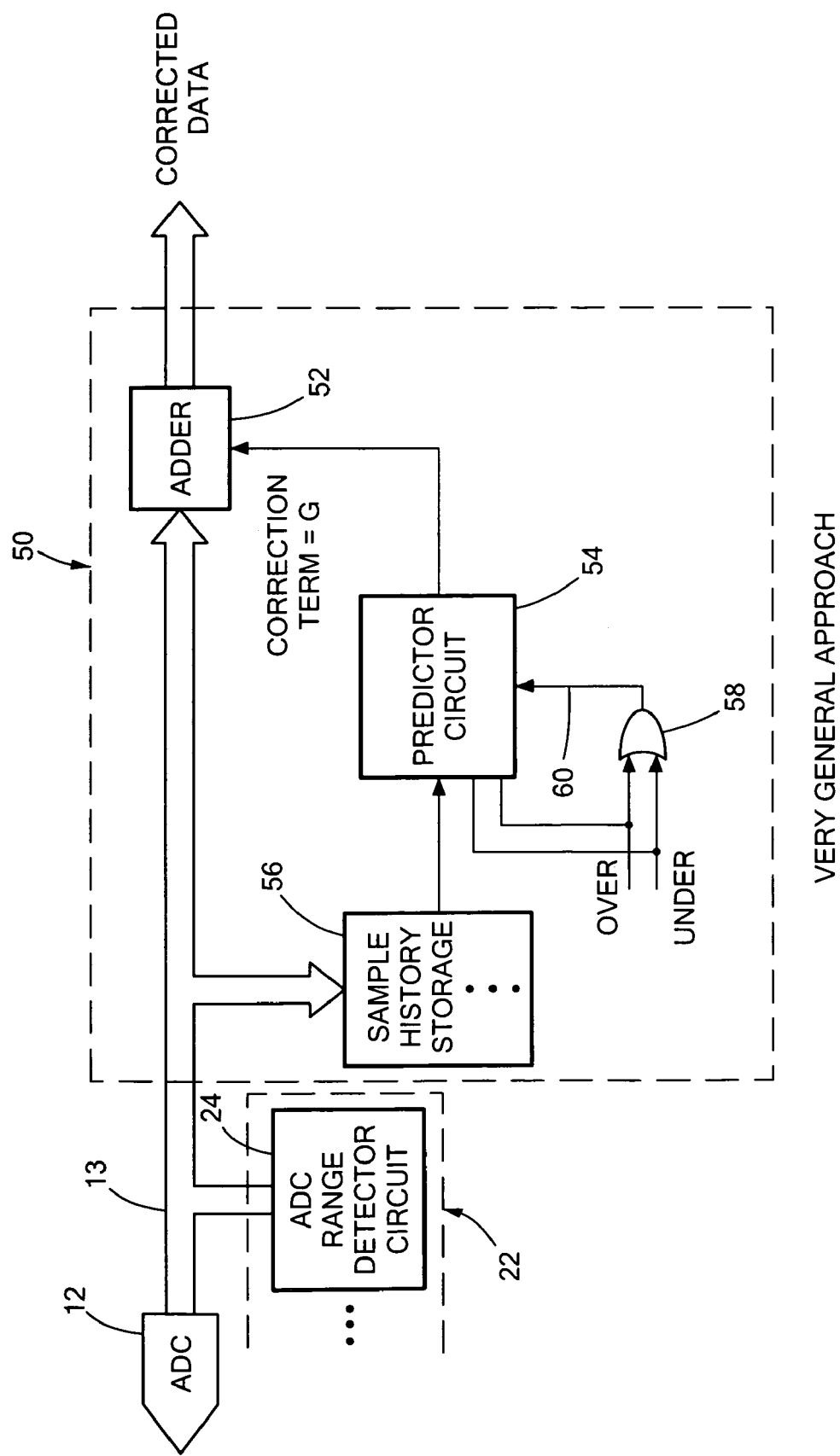
FIG. 4 is a schematic block diagram of a correction circuit for the automatic range shift system of this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

The invention uses a control circuit to automatically update the DAC to keep the signal in range by monitoring the ADC output. If the ADC output code falls below a fixed lower threshold then the DAC is decremented to increase the input signal to the ADC and pull the ADC codes towards centre scale. If the ADC output rises above a fixed upper threshold then the DAC is increased, reducing the input signal to the ADC and again pulling the ADC codes towards centre scale. Herein is disclosed an ADC system that automatically sets the DAC value so as to keep the ADC within it operating sub-span for a wide range of applied inputs. The DAC is configured automatically by a digital control circuit which uses the ADC data. The action of the DAC control circuit is to keep the converter output between a lower fixed threshold and an upper fixed threshold, typically ¼ and ¾ of range. If the ADC data is outside of this range, then the DAC code is altered to shift the conversion result back to nominally centre scale. There may be a filter associated with the ADC to remove disturbance from the signal, for example, when the part is used in a noisy environment so that the ADC output level is communicated not directly to the DAC control circuit but through the filter. In some cases it is beneficial to base the DAC update decision on an average of the ADC data, and not the raw data itself, to guard against spurious DAC updates caused by noisy ADC outputs.

For every ADC conversion, the DAC control circuit checks that the conversion average does not exceed ¼ or ¾ of the converter full-scale range. If the conversion result causes the average to fall outside of the ¼ to ¾ range, then it needs to be re-centered to nominally centre scale. Simply reducing/increasing the DAC by one code would just bring the moving average barely into the ¼ to ¾ range, and would potentially result in multiple DAC updates.

There is shown in FIG. 1 an automatic range shift system 10 according to this invention for an ADC 12 whose external input comes from some sensor 14, for example, a capacitive sensor. Shift system 10 includes a summing circuit 16 which receives an external input 15 from sensor 14 and the output of DAC 18 to provide an input 20 to ADC 12. The output of ADC 12 is monitored by a control circuit 22 which may include an ADC range detector circuit 24 and a DAC code adjust circuit 26. In operation, control circuit 22 monitors ADC 12 output 13 to see whether it exceeds predetermined range limits: goes above an upper limit or below a lower limit. If it does not, that is, if output 13 of ADC 12 is within the limits then no output is provided from control circuit 22 to DAC 18 and DAC 18 output to summing circuit 16 remains unchanged. However, if control circuit 22 detects that output 13 has indeed either gone over the upper limit or under the lower limit it provides a new code to DAC 18. ADC 12 may have a filter 11 associated with it to remove disturbances from the ADC output before it is delivered to ADC range detector 24, for example, when there is noise present. In operation, if output 13 of ADC 12 goes above the upper limit, control circuit 22 will drive DAC 18 to increase its signal to summing circuit 16. Assuming a slowly changing input 15 from sensor 14 the input signal 20 from summing circuit 16 to ADC 12 will be reduced due to the larger signal from DAC 18. Conversely, if control circuit 22 indicates that output 13 of ADC 12 is under the lower limit, code word adjust to DAC 18 will drive its output lower and so the ultimate ADC input signal 20 to ADC 12 will be increased. In control circuit 22 ADC range detector circuit 24 detects whether the output 13 of ADC 12 is over 28 or under 30 predetermined range limits. Depending upon those inputs the DAC code adjust circuit 26 provides the appropriate code to DAC 18.

ADC range detector circuit 24, FIG. 2, may include simply a pair of comparators 32, 34. Comparator 32 receives as one input lower limit 36 and as the other the output 13 from ADC 12. Comparator 34 receives as one input upper limit 38 and at the other, again, the ADC output 13. If ADC output 13 is above upper limit 38, comparator 34 puts out an over signal. If ADC output 13 is under lower limit 36 comparator 32 puts out an under signal. Those over and under signals are submitted to an adder 40, FIG. 3, which along with DAC register 42 may be used to implement DAC code adjust circuit 26. The over and under signals enable adder 40 to either add or subtract, respectively. The amount that adder 40 will add or subtract from the amount of the DAC code word already stored in DAC register 42 is determined by the adjust term on line 44. The adjust term is determined from the configurations of ADC 12 and DAC 18. For example, if ADC 12 was a capacitive input ADC with gain ranges of ½ ρf; 1 ρf; 2 ρf; 4 ρf, and assuming DAC 18 having steps of one-sixth or 0.166 ρf with a range of 0-5 ρf in five steps providing 0-31 codes, the adjust terms for each of the ADC gain ranges would be one, two, four and eight, respectively.

Note that ADC range detector circuit 24 can be implemented by simply monitoring the two most significant bits of the ADC output data 13 when operating in a ¾, ¼ range limits. If both MSBs are one then you are at the top of the ¾ limit and you should increase your DAC output. So for example if the ADC has a one volt span you would reduce the DAC output by ¼ of a volt to the ½ range positions. In contrast if the MSBs are both zeros then you would be at the lower ¼ range limit and the DAC output would be increased by a ¼ volt. Similarly if the upper and lower range limits were ⅞ and ⅛ one could look at the three most significant bits.

A further feature of this invention is to use a combination of ADC conversion results before and after the DAC update to calculate the DAC step to within the accuracy of the ADC. This allows large input signal variations (outside of the reduced ADC span) to be measured in addition to the smaller short-term variations, without introducing errors due to inaccuracies in the offsetting DAC. The action of the control circuit updates the DAC to keep the ADC within range. However, the DAC update will cause a step change in the ADC input, and a corresponding step change in the ADC output. Therefore to continue to measure the ADC input accurately, the ADC output codes must be corrected to compensate for the shift caused by the DAC update. Since the DAC code change is known, it could be possible to add/subtract a fixed adjustment. However, in practical systems the DAC itself will have errors—the actual DAC output will differ from the value calculated from the DAC code change. This error is equivalent to an error in the fixed adjustment term, and ultimately results in an error in the compensated ADC output.

There is shown in FIG. 4 a correction circuit 50 including a summing circuit such as adder 52, a predictor circuit 54, and a sample history storage 56. There is also an OR gate 58 which provides an enable signal on line 60 to predictor circuit 54 upon receiving either an over or an under limit signal. In operation, a signal on line 60 indicates to predictor circuit 54 that DAC 18, FIG. 1, has been updated and therefore an inherent error will occur in the output 13 of ADC 12, FIG. 4. To compensate for this, predictor circuit 54 reviews a history of samples stored in storage 56 to predict what the likely error will be and then provides a correction term, G, to adder 52 which will add or subtract the correction term from output 13 depending upon whether the upper or lower range limits have been exceeded, as enabled by the over and under signals.

Figure 5:
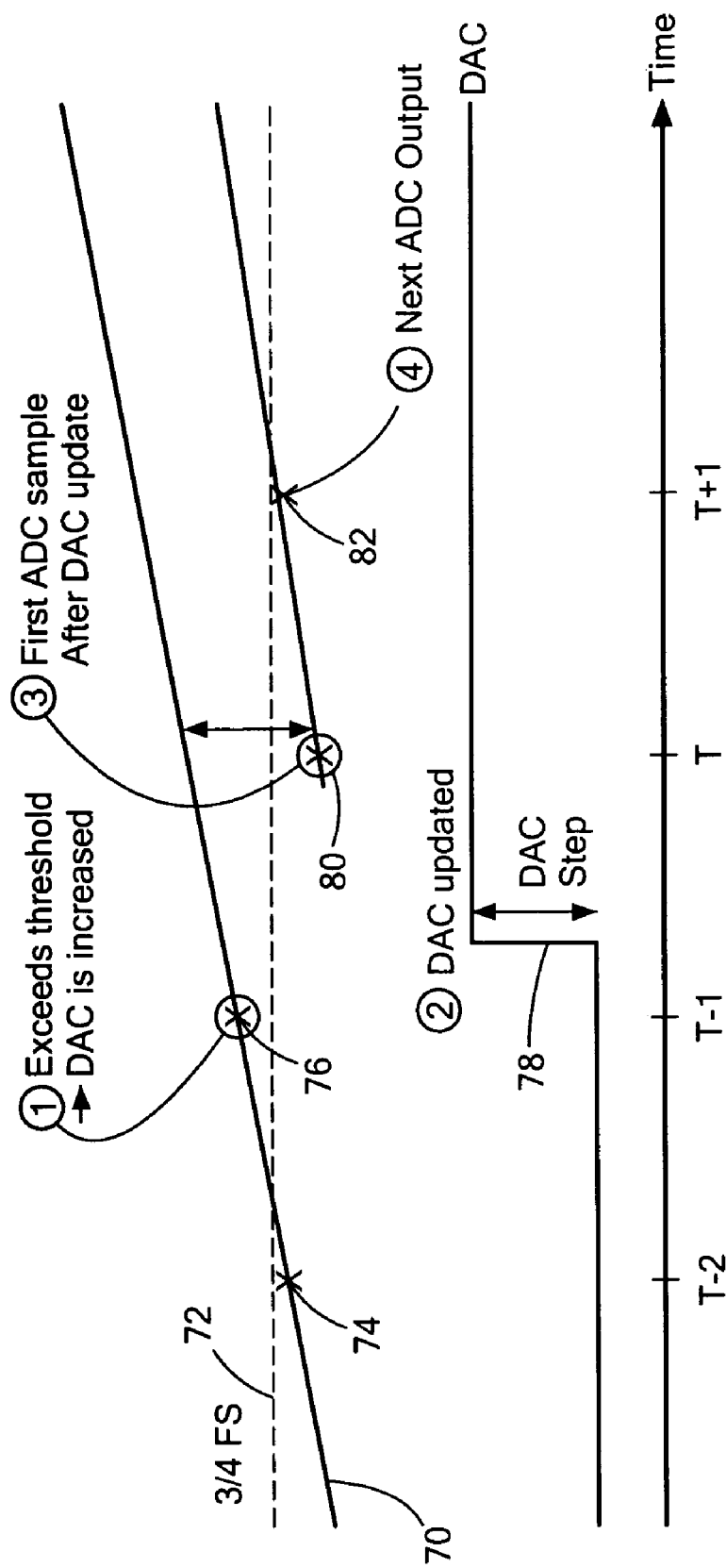
FIG. 5 is an illustration showing the relationship among the external input, ADC output and DAC output in a conventional configuration.
Figure 6:
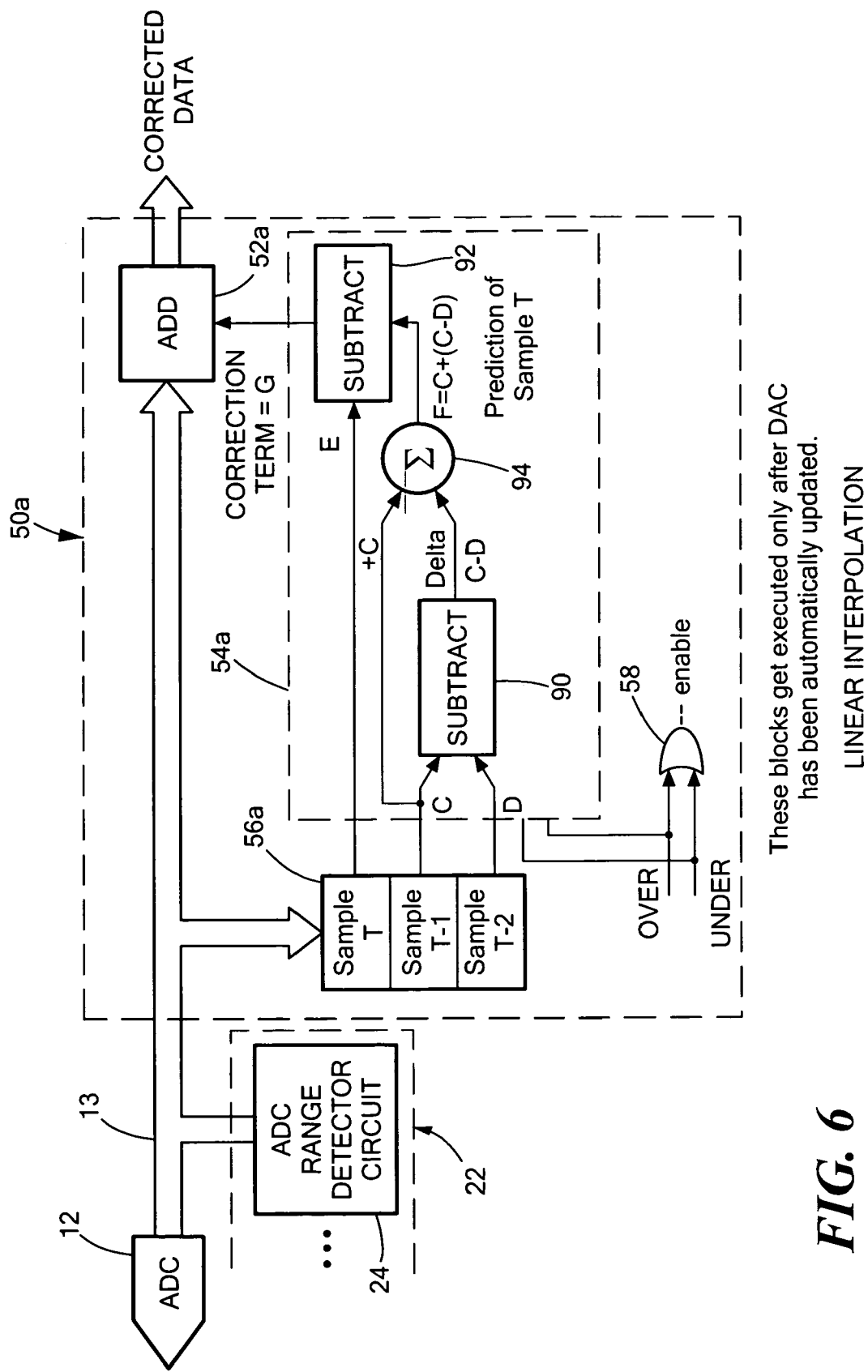
FIG. 6 is a schematic block diagram similar to FIG. 4 showing the stage and predictor circuit in more detail.

The invention can perhaps be better understood with reference to the underlying problem disclosed in FIG. 5. The external input to the ADC is represented by line 70. The upper limit set at ¾'s of Full Scale (FS) of the ADC range is shown at 72. The lower axis is time with the periods T−2, T−1, T and T+1 being represented there. At time T−2 the raw ADC output code represented by X at 74 is below the threshold 72 and so the event goes undetected. At time T−1, however, the output 76 is above threshold 72 and so DAC 18 is updated as shown by the occurrence of step 78. When DAC is updated by the amount shown the resulting input to the ADC will be decreased by a similar amount as shown by the fact that the next output code 80 is substantially below line 70. As long as the DAC remains in this condition the difference between the external input 70 and the ADC outputs 80 and 82 will remain the same. The difference between the line now represented by ADC outputs 80 and 82 and the line 70 constitutes an error. It is this error for which the correction term is generated in accordance with this invention. Correction circuit 50*a*, FIG. 6, designed to accommodate for this error may include storage 56*a* which stores samples from times T, T−1 and T−2. It may also include a predictor circuit 54*a* which includes subtractor 90, subtractor 92, and summing circuit 94.

In operation, subtractor 90 receives the samples denominated C and D from sample times T−1 and T−2, subtracts those and provides the output C−D which is the increment or Δ between the samples taken at those times. That Δ is combined in summing circuit 94 with the last previous sample T−1, to obtain the prediction F for the sample at time T, where F equals C+(C−D). The sample T denominated E is combined with F in subtractor 92 to come up with correction term G, which is then either added or subtracted by adder 52*a* to the output 13 of ADC 12 depending upon whether the upper of lower range limit was crossed.

Figure 7:
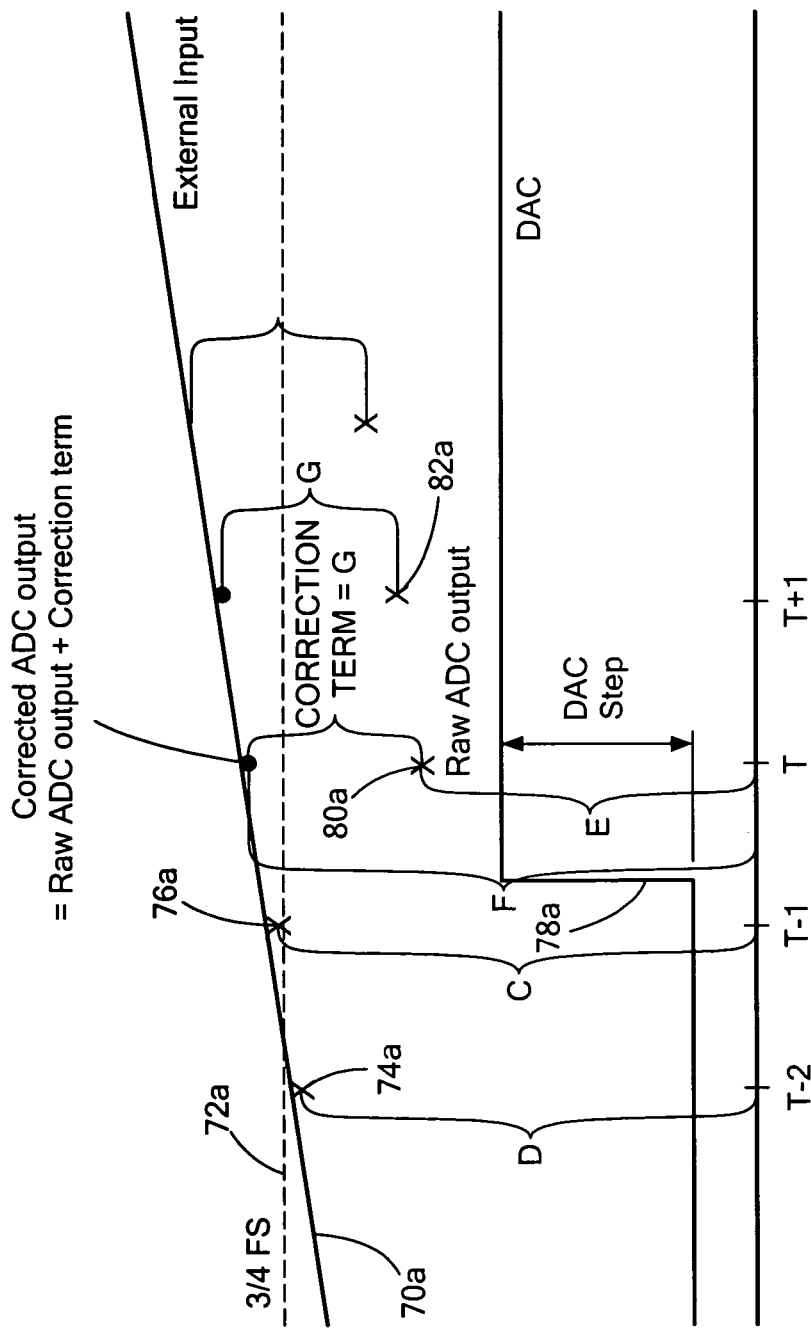
FIG. 7 is a view similar to FIG. 5 with the ADC output corrected according to this invention.

This may be better understood with reference to FIG. 7, where similar elements have been given similar numbers accompanied by a lower case letter. Here the quantities D, C, F, E, and G from FIG. 6, have been defined. D is the quantity from the axis at time T−2 to the raw ADC output at 74*a*. C is the distance at time T−1 from the axis to raw data output 76*a*. E is the distance from the axis at time T to the raw data 80*a* and F is the distance from the axis at time T to the corrected output after adding the correction term G to the value E. The correction term G can then be used again at 82*a* and so on as long as the DAC remains in the same condition and until the next step is executed. Assuming a linear variation of input 70*a*, from FIGS. 6 and 7 it can be seen that F at sample time T is equal to $$F = C + (C-D) \tag{1}$$

then $$\text{correction term } G = E - F \tag{2}$$

$$G = E - [C + (C-D)] \tag{3}$$

$$G = E - C - C + D \tag{4}$$

$$G = E - 2C + D \tag{5}$$

Figure 8:
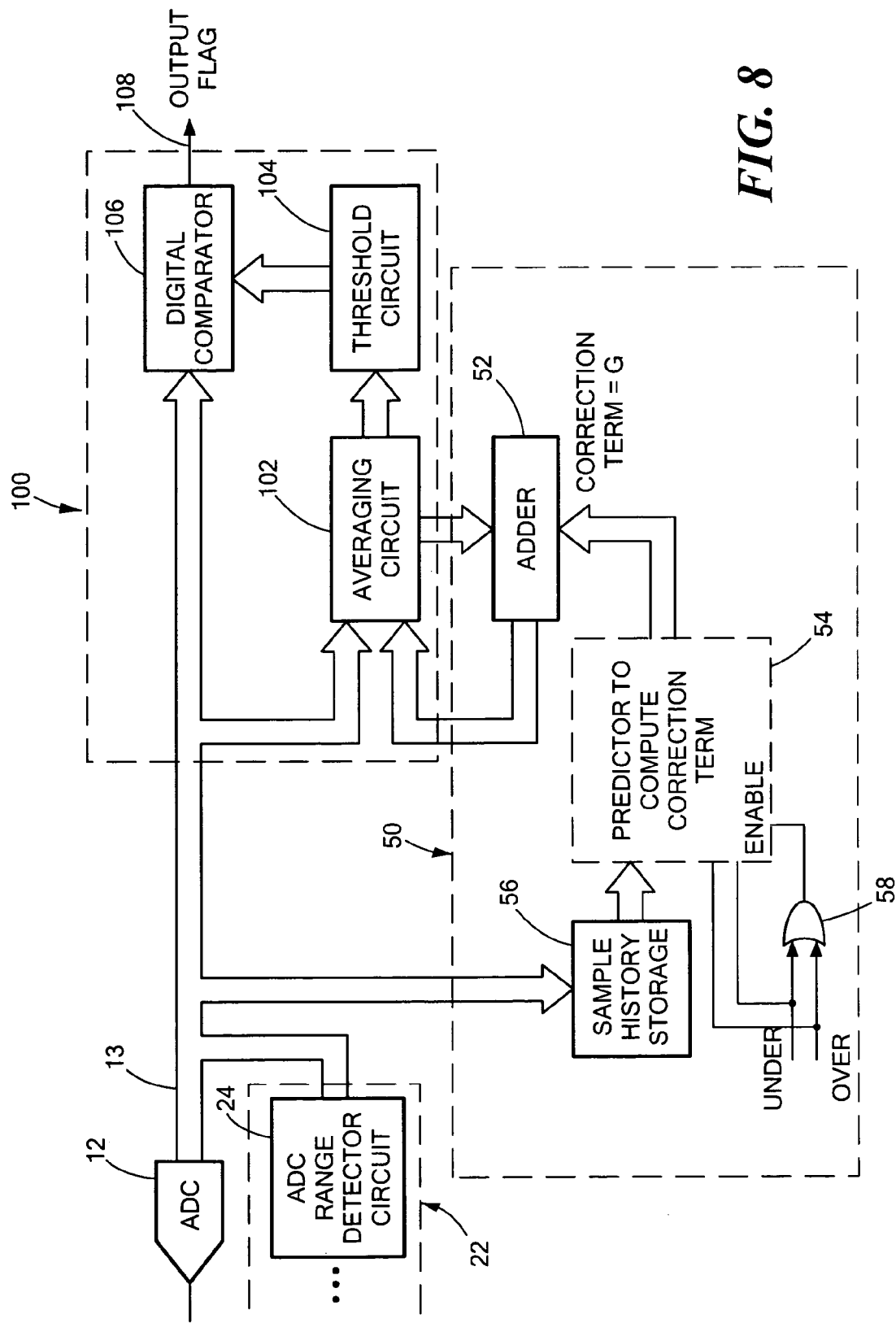
FIG. 8 is a schematic block diagram of a capacitive sensing circuit employing an automatic range shift system according to this invention.

In one application where the system is used in conjunction with a capacitive sensing device the important output information is not the data in an absolute sense but how the data changed or did not change against the background average. In that case a threshold averaging circuit 100, FIG. 8, employs an averaging circuit 102 which obtains an average of the ADC 12 output 13. The ADC output is submitted to threshold averaging circuit 100 which includes averaging circuit 102, and a threshold circuit 104 which sets the threshold typically a fixed amount above (or below) the average output of averaging circuit 102. Digital comparator 106 compares the ADC 12 output 13 and if it exceeds the threshold set by circuit 104 the comparator provides an output flag 108 indicating that there has been a significant change in the capacitance relative to the recent capacitor value. One variation in this implementation is that, for a change after an input above the upper limit, adder 52 actually subtracts correction term G from the average value determined by averaging circuit 102, whereas previously the correction term G was added to the ADC data.

Figure 9:
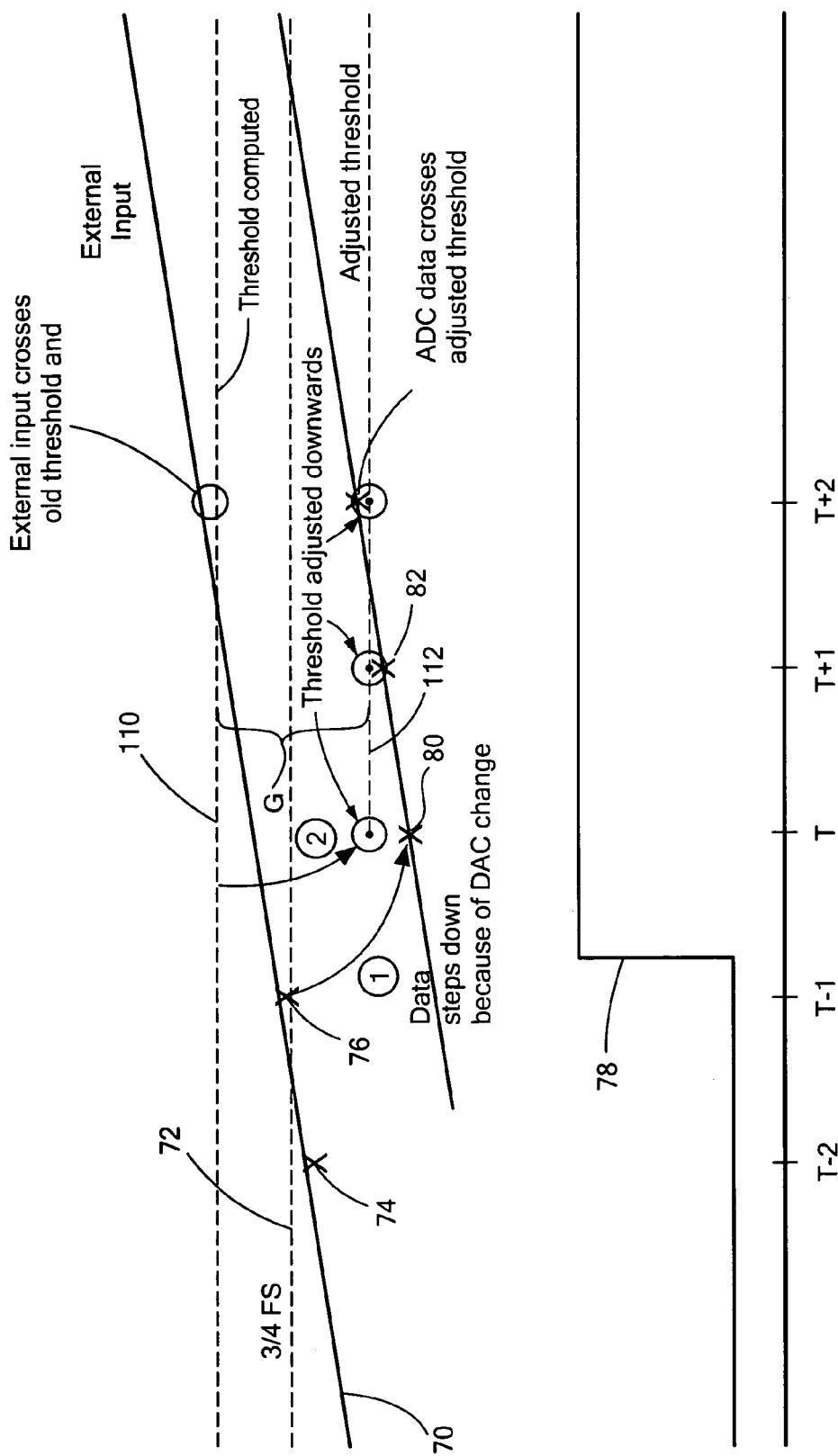
FIG. 9 is an illustration showing FIGS. 5 and 7 with the ADC correction applied to the average ADC output instead of the ADC output.

This can perhaps be better understood with reference to FIG. 9, where it can be seen that once again the step 78 introduced by DAC 18 has caused a decrease in the values of the ADC raw data output 80, 82, but that instead of raising them up towards external input line 70 the threshold 110 computed from the average output in circuit 102 has been reduced or lowered by the necessary amount of the correction term G so that the data steps 80 and 82 have the same relationship to the threshold without themselves having been moved. That is, in the previous example shown in FIG. 7, the correction term was used to move the values 80, 82 up toward the actual input, whereas in FIG. 9 the threshold has been moved down to where the inputs are but still maintaining the same relationship between the inputs 80, 82 and the adjusted threshold 112. That is, having subtracted the correction term G from the average value produced by averaging circuit 102, the average is now lower than it would ordinarily be and so the threshold calculated upon that lowered average will also be lowered. Thus the adjusted threshold 112 is lower that the threshold 110. It should be understood that this explanation for purposes of simplicity is with respect to the upper range limit being violated rather than the lower but the equivalent result occurs in that instance too.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An automatic range shift system for an analog to digital converter (ADC) comprising:
    a digital to analog converter (DAC);
    a first summing circuit for combining an external analog input and said DAC output to provide an input to the ADC; and
    a control circuit for detecting whether the range of the output of an ADC is above a predetermined upper range limit or below a predetermined lower range limit and generating an adjustment code to increase the DAC output if the ADC output is above the upper range limit and to decrease said DAC output if said ADC output is below said lower range limit for decreasing the ADC input when the ADC output is above the upper limit and to increase the ADC input when the ADC output is below the lower limit to keep the ADC input within the ADC range.

2. The automatic range shift system of claim 1 in which said ADC includes a filter.

3. The automatic range shift system of claim 1 in which said control circuit includes a range detector for detecting whether the output of an ADC is above a predetermined upper or below a predetermined lower range limit; and a DAC code adjust circuit responsive to said range detector for generating an adjustment code to increase said DAC output if said ADC output is above said upper range limit and to decrease said DAC output if said ADC output is below said lower range limit to decrease the ADC input when the ADC output is above the upper limit and to increase the ADC input when the ADC output is below the lower limit to keep the ADC input within the ADC range.

4. The automatic range system of claim 3 in which said range detectors include a comparator circuit.

5. The automatic range system of claim 4 in which said comparator circuit includes a lower comparator to compare the ADC output with said lower limit and an upper comparator to compare the ADC output with said upper limit.

6. The automatic range system of claim 3 in which said DAC code adjust circuit includes a register for storing the present DAC code and an adder for adding or subtracting an adjust term in response to said ADC output being above said upper limit or said ADC output being below said lower limit.

7. The automatic range system of claim 3 further including a correction circuit having a storage device for storing a sample history of the ADC output; a predictor circuit responsive to said DAC adjustment for generating a correction term and a second summing circuit for combining the correction term with the ADC output to correct for the DAC adjustment to the ADC.

8. The automatic range system of claim 7 in which said second summing circuit adds said correction term to the ADC output when the ADC output is above said upper limit and subtracts it from the ADC output when the ADC output is below said lower limit.

9. The automatic range system of claim 3 further including an averaging circuit responsive to said ADC output to provide an average ADC output.

10. The automatic range system of claim 9 further including a correction circuit having a storage device for storing a sample history of the ADC output; a predictor circuit responsive to said DAC adjustment for generating a correction term; and a third summing circuit for combining the correction term with the average ADC output to correct for the DAC adjustment to the ADC.

11. The automatic range system of claim 10 in which said third summing circuit subtracts said converter term from the average ADC output when the ADC output is above said upper limit and adds it to the average ADC output when the ADC output is below the lower limit.

12. The automatic range system of claim 11 further including a threshold circuit responsive to said averaging circuit for defining an average threshold and a comparator responsive to said threshold circuit and said ADC output for indicating when the ADC output has moved beyond said threshold relative to said average ADC output.

13. An automatic range shifting method for an analog to digital converter (ADC) comprising:
    combining an external analog input and a DAC output to provide an input to the ADC;
    detecting whether the range of the output of an ADC is above a predetermined upper range limit or below a predetermined lower range limit; and
    generating an adjustment code to increase the DAC output if the ADC output is above the upper range limit and to decrease said DAC output if said ADC output is below said lower range limit for decreasing the ADC input when the ADC output is above the upper limit and to increase the ADC input when the ADC output is below the lower limit to keep the ADC input within the ADC range.

14. The automatic range shifting method of claim 13 in which the ADC output is filtered before being used to generate an adjustment code for the DAC.

15. The automatic range shifting method of claim 13 in which the ADC output is compared with said lower limit and with said upper limit.

16. The automatic range shifting method of claim 13 in which generating an adjustment code includes storing the present DAC code and adding or subtracting an adjust term in response to the ADC output being above said upper limit or the ADC output being below said lower limit.

17. The automatic range shifting method of claim 13 further including storing a sample history of the ADC output; generating a correction term and combining the correction term with the ADC output to correct for the DAC adjustment to the ADC.

18. The automatic range shifting method of claim 17 in which said correction term is added to the ADC output when the ADC output is above said upper limit and is subtracted from the ADC output when the ADC output is below said lower limit.

19. The automatic range shifting method of claim 13 further including averaging said ADC output to provide an average ADC output.

20. The automatic range shifting method of claim 19 further including storing a sample history of the ADC output; generating a correction term; and combining the correction term with the average ADC output to correct for the DAC adjustment to the ADC.

21. The automatic range shifting method of claim 20 further including subtracting said converter term from the average ADC output when the ADC output is above said upper limit and adding it to the average ADC output when the ADC output is below the lower limit.

22. The automatic range shifting method of claim 21 further including defining an average threshold indicating when the ADC output has moved beyond said threshold relative to said average ADC output.

* * * * *